United States Patent [19]

Onishi, deceased et al.

[11] Patent Number: 4,564,925
[45] Date of Patent: Jan. 14, 1986

[54] SEMICONDUCTOR MEMORY

[75] Inventors: Yoshiaki Onishi, deceased, late of Kokubunji, Japan; by Junko Onishi, administratrix, Nagoya, Japan; Hiroshi Kawamoto, Kodaira; Tokumasa Yasui, Higashiyamato, both of Japan

[73] Assignee: Hitachi, Ltd., Tokyo, Japan

[21] Appl. No.: 535,056

[22] Filed: Sep. 23, 1983

[30] Foreign Application Priority Data

Sep. 24, 1982 [JP] Japan ................................. 57-164831

[51] Int. Cl.$^4$ .............................................. G11C 7/00
[52] U.S. Cl. .................................... 365/203; 365/189
[58] Field of Search ................. 365/189, 203, 206, 230

[56] References Cited

U.S. PATENT DOCUMENTS

| | | | |
|---|---|---|---|
| 4,338,679 | 7/1982 | O'Toole | 365/203 |
| 4,339,809 | 7/1982 | Stewart | 365/206 |
| 4,472,792 | 9/1984 | Shimohigashi et al. | 365/189 |

FOREIGN PATENT DOCUMENTS

| | | |
|---|---|---|
| 2430690 | 1/1975 | Fed. Rep. of Germany . |
| 2658655 | 7/1977 | Fed. Rep. of Germany . |
| 2734361 | 3/1978 | Fed. Rep. of Germany . |
| 3101520 | 8/1982 | Fed. Rep. of Germany . |
| 3217493 | 12/1982 | Fed. Rep. of Germany . |

Primary Examiner—Joseph A. Popek
Attorney, Agent, or Firm—Antonelli, Terry & Wands

[57] ABSTRACT

A semiconductor memory has dynamic memory cells, such as one-MOS transistor cells, a detector circuit which detects changes in applied address signals, and a timing generator circuit which receives detection outputs of the detector circuit. When the address signals are changed, various timing signals are responsively produced from the timing generator circuit. In response to the timing signals generated in succession, data lines to which the memory cells are coupled are first precharged, and one of the memory cells is selected after the precharge of the data lines. Data delivered from the selected memory cell to the data line is amplified when the operation of a sense amplifier is started. The amplified data is supplied to an external terminal through a column switch, a main amplifier, an output amplifier, etc., which are similarly operated in succession. Since the semiconductor memory of this arrangement forms a pseudo-static memory, it requires only a small number of external timing signals. In order to obtain a desirable pseudo-static memory, a data line precharge level is equalized to half of the supply voltage level, and the sense amplifier is constructed of a CMOS-FET latch circuit. As a result, the period of time from the change of the address signals until the delivery of the output data can be sufficiently shortened. It is therefore possible to form a pseudo-static memory which is, in effect, regarded as a static memory.

9 Claims, 4 Drawing Figures

SEMICONDUCTOR MEMORY

BACKGROUND OF THE INVENTION

This invention relates to a semiconductor memory, and more particularly, to a semiconductor memory which includes insulated-gate field effect transistors (hereinbelow, termed "MOSFETs") as principal circuit elements.

Semiconductor memories, for example, random access memories (RAMs), are classified into the dynamic type and the static type. Since the dynamic type RAM is smaller than the static type in the number of elements constituting the memory cells provided for storing data, the former is readily implemented with a large capacity as compared with the latter. The dynamic type RAM, however, needs to be externally supplied with more timing signals for operation than those of the static type RAM and has the disadvantage of a difficult timing control.

The inventors of the present invention have therefore developed a pseudo-static type RAM which can be put into a large memory capacity and the external timing control of which is simple, as in the static type RAM.

SUMMARY OF THE INVENTION

An object of this invention is to provide a semiconductor memory the external timing control of which can be simplified.

Another object of this invention is to provide a semiconductor memory which can perform a fast operation and which can be rendered high in the density of integration.

Still another object of this invention is to provide a novel semiconductor memory which is composed of complementary MOSFETs.

Further objects and features of this invention will become apparent from the following description when taken in conjunction with the accompanying drawings.

DETAILED DESCRIPTION OF THE PREFERRED EMBODIMENT

Figure 1:
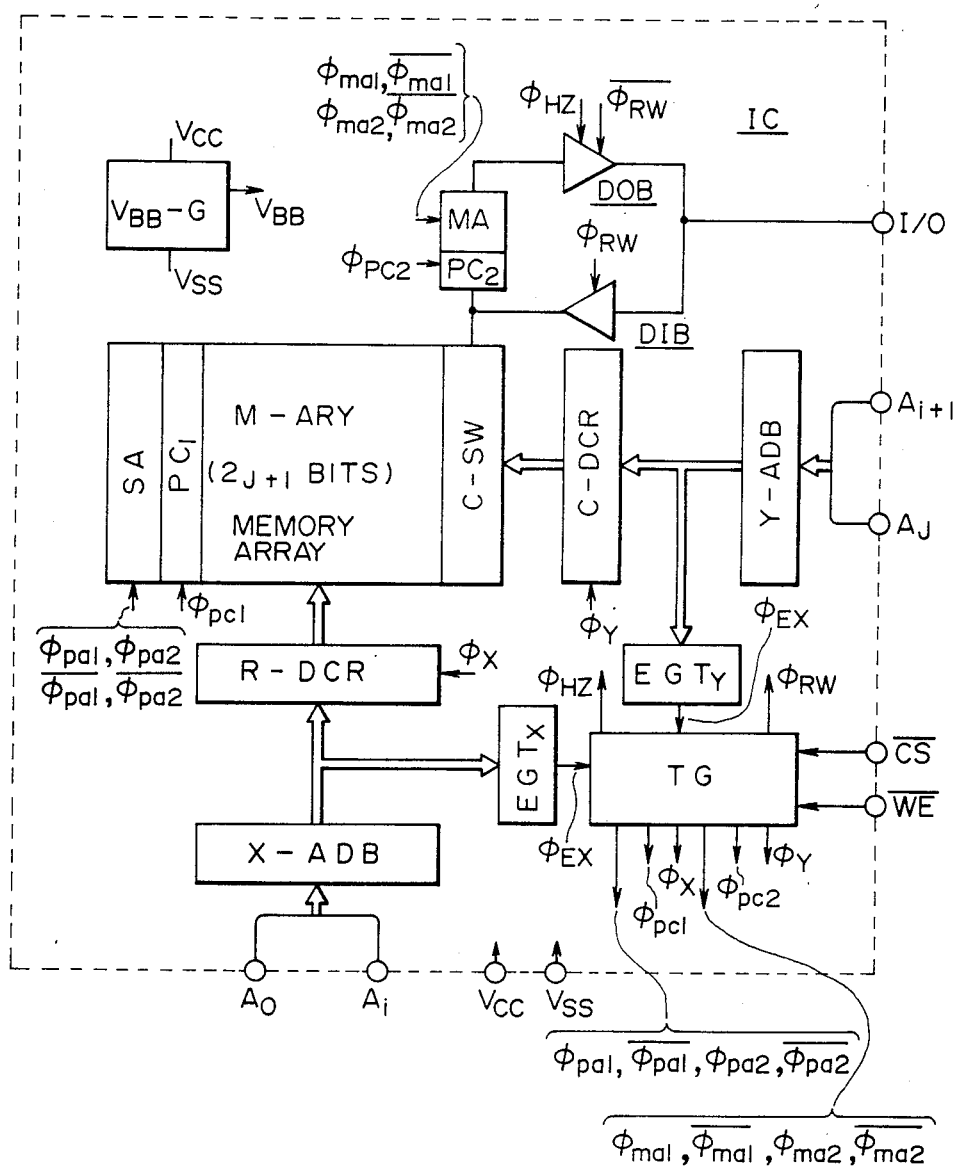
FIG. 1 is a schematic block diagram showing an embodiment of this invention.

FIG. 1 shows a block diagram of one embodiment of this invention in which various circuit blocks enclosed with a dotted line are formed on a single semiconductor substrate in accordance with the known manufacturing technology relating to CMOS (Complementary Metal-Oxide-Semiconductor) integrated circuits. Terminals I/O $A_{i+1}$ to $A_j$; $\overline{CS}$, $\overline{WE}$; $A_O$ to $A_i$; and $V_{CC}$, $V_{SS}$ are formed as the external terminals of the single chip. A supply voltage is fed across the terminals $V_{CC}$ and $V_{SS}$ from a proper external power supply unit (not shown).

Within the chip is a memory array M-ARY composed of a plurality of known 1-MOSFET type memory cells arranged in the form of a matrix. Each memory cell is constructed of one MOSFET and one capacitor. In this embodiment, the memory array has a folded bit line organization, though it is not especially restricted thereto. In the memory array of the folded bit line organization, the respective memory cells have their input or output nodes coupled to either of a pair of complementary data lines D and $\overline{D}$ extended on the semiconductor substrate in parallel to each other, as will be understood from FIGS. 2A and 2B, which will be referred to in detail later.

A data line precharge circuit $PC_1$ is constructed of a MOSFET that short-circuits the complementary data lines D and $\overline{D}$ by receiving a precharge pulse $\phi_{pc1}$. The complementary data lines D and $\overline{D}$ are also coupled to a sense amplifier SA. As understood from FIG. 2A, to be referred to in detail later, the sense amplifier SA is constructed of a plurality of unit circuits each of which is made up of a CMOS (complementary type metal-oxide-semiconductor) FET latch circuit, and power switch MOSFETs which are respectively disposed on the supply voltage $V_{CC}$ side of the unit circuits and the ground potential $V_{SS}$ side of the circuitry. A pair of input and output nodes of the sense amplifier are coupled to the complementary data lines D and $\overline{D}$ corresponding thereto. The power switch MOSFETs disposed on the supply voltage $V_{CC}$ side and the ground potential $V_{SS}$ side of the circuitry, respectively, have their on/off operations controlled by timing signals $\overline{\phi_{pa1}}$, $\overline{\phi_{oa2}}$ and $\phi_{pa1}$, $\phi_{pa2}$.

A column switch C-SW is provided by which only one pair of complementary data lines to be selected are coupled to common complementary data lines in accordance with column select signals supplied from a column address decoder C-DCR to be described later.

An X address buffer X-ADB forms internal complementary address signals $a_O$, $\overline{a_O}$ to $a_i$, $\overline{a_i}$ in response to external address signals received through the terminals $A_O$ to $A_i$. Similarly, a Y address buffer Y-ADB forms internal complementary address signals $a_{i+1}$, $\overline{a_{i+1}}$ to $a_j$, $\overline{a_j}$ in response to external address signals received through the terminals $A_{i+1}$ to $A_j$. A row address decoder R-DCR forms the word line select signals of the memory array M-ARY in response to the complementary address signals $a_O$, $\overline{a_O}$ to $a_i$, $\overline{a_i}$. The word line select signals are transmitted to the memory array M-ARY in synchronism with a timing pulse $\phi_X$. On the other hand, a column address decoder C-DCR forms data line select signals to be supplied to the memory array M-ARY in response to the complementary address signals $a_{i+1}$, $\overline{a_{i+1}}$ to $a_j$, $\overline{a_j}$. The data line select signals are transmitted to the column switch C-SW in synchronism with a timing pulse $\phi_Y$.

A precharge circuit $PC_2$ is provided for precharging the common data lines and is constructed of a MOSFET that short-circuits the common complementary data lines by receiving a precharge pulse $\phi_{pc2}$. A main amplifier MA is also connected to the common complementary data lines. The main amplifier MA has a circuit arrangement similar to that of the sense amplifier SA. That is, the main amplifier MA is constructed of a CMOS FET latch circuit, and power switch MOSFETs which are respectively disposed on the supply voltage $V_{CC}$ side of the latch circuit and the ground potential $V_{SS}$ side of the circuitry. A pair of input and output nodes of the CMOS FET latch circuit are respectively coupled to the pair of common complementary data lines. The respective power switch MOSFETs have their on/off operations controlled by timing signals $\overline{\phi_{ma1}}$, $\overline{\phi_{ma2}}$ and $\phi_{ma1}$, $\phi_{ma2}$.

A data output buffer DOB is provided which responds to a timing signal $\overline{\phi_{RW}}$ to supply the external terminal I/O with data corresponding to read data fed from the main amplifier MA. During a writing operation, the data output buffer DOB is held in its nonoperating status by the timing signal $\overline{\phi_{RW}}$. In addition, a timing signal $\phi_{HZ}$ places the output of the DOB at a high impedance during a reading operation. This timing signal $\phi_{HZ}$ is principally used for performing a refresh operation. The illustrated memory is so constructed that, when the address signals are changed in the status of the reading operation, the refresh operation is responsively executed. With the arrangement wherein the output of the data output buffer DOB is brought to the high impedance state by the timing signal $\phi_{HZ}$, wired OR logic can be simply formed among the outputs of a plurality of semiconductor memories.

A data input buffer DIB is provided which responds to a timing signal $\phi_{RW}$ to supply the common data lines with write data fed to the terminal I/O. During the reading mode, the buffer DIB is held in its nonoperating status by the timing signal $\phi_{RW}$.

In this embodiment, the various timing signals mentioned above are formed by various circuit blocks to be described. An edge trigger circuit (address transient detector) $EGT_X$ is provided which detects the rising or falling edges of the internal address signals $a_0$ to $a_i$ (or $\overline{a_0}$ to $\overline{a_i}$), though not especially restricted thereto. Similarly, an edge trigger circuit (address transient detector) $EGT_Y$ is provided which detects the rising or falling edges of the internal address signals $a_{i+1}$ to $a_j$ (or $\overline{a_{i+1}}$ to $\overline{a_j}$), though not especially restricted thereto. Although no special restriction is intended, each of the edge trigger circuits $EGT_X$ and $EGT_Y$ is constructed of exclusive OR circuits which receive the internal address signals $a_0$ to $a_i$ and $a_{i+1}$ to $a_j$ and the delay signals thereof, respectively, and an OR circuit which receives the outputs of the exclusive OR circuits, as will be described in more detail later. When the level of at least one of the internal address signals $a_0$ to $a_i$ and $a_{i+1}$ to $a_j$ has changed, the edge trigger circuits $EGT_X$ and $EGT_Y$ form edge detection pulses $\phi_{EX}$ and $\phi_{EY}$ in synchronism with the timing of the change, respectively.

Since the edge detection pulse $\phi_{EX}$ indicating the transient of the row address signals and the edge detection pulse $\phi_{EY}$ indicating the transient of the column address signals are clearly distinguished, generation of the timing signals which ought to respond to the transient of the row address signals and those which ought to respond to the transient of the column address signals is facilitated.

A timing generator circuit TG is provided which forms the various timing signals referred to previously. The timing generator circuit TG forms the series of timing pulses by receiving a write enable signal $\overline{WE}$ and a chip select signal $\overline{CS}$ from the corresponding external terminals, besides the edge detection pulses $\phi_{EX}$ and $\phi_{EY}$.

Figure 2A:
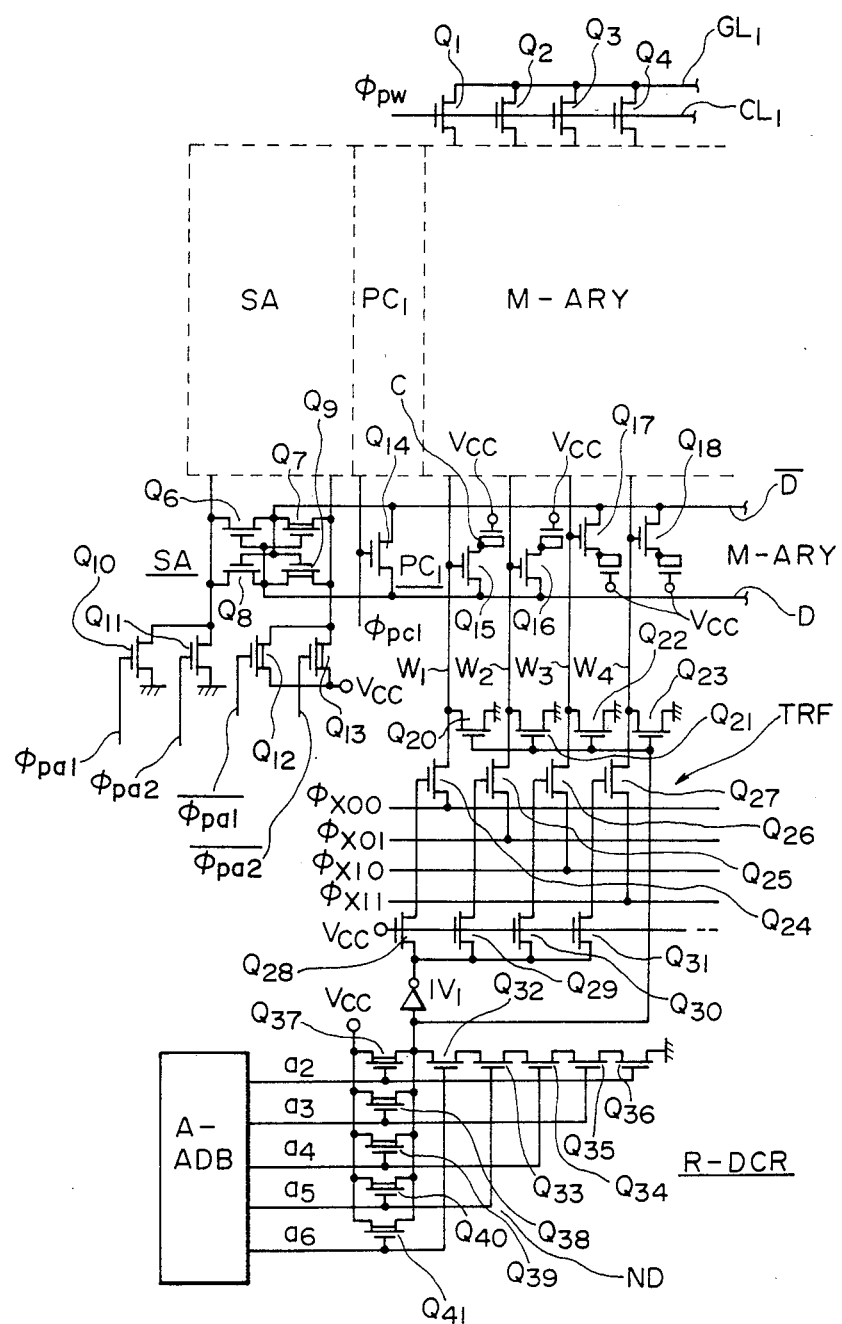
FIGS. 2A and 2B are circuit diagrams showing a practicable form of the disclosed embodiment.
Figure 2B:
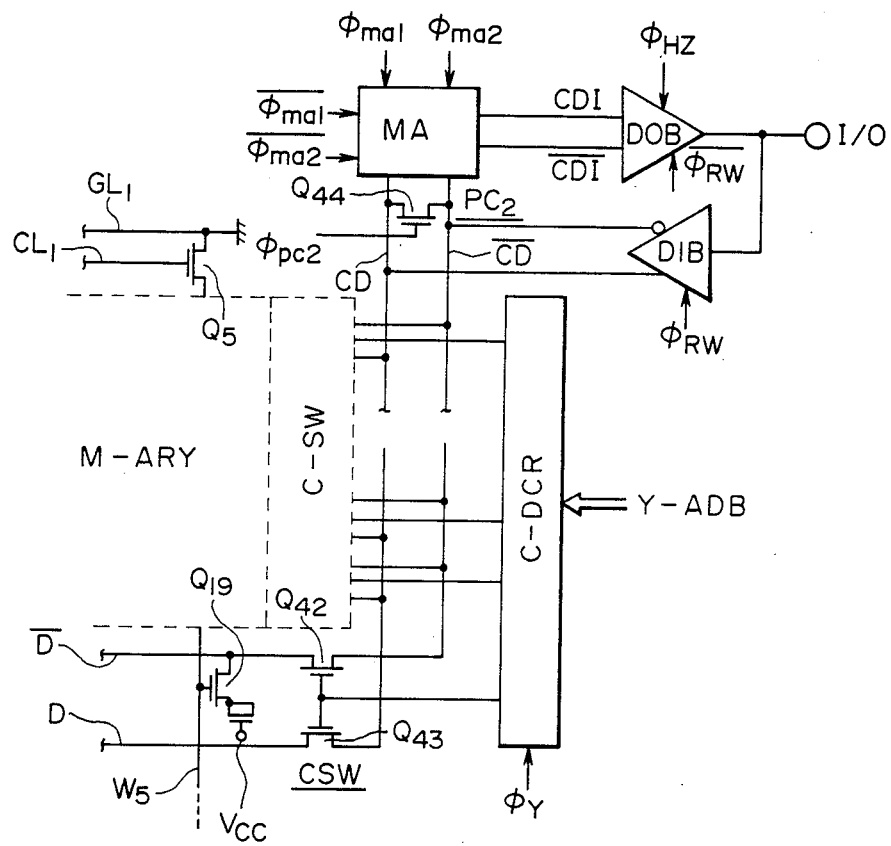

FIGS. 2A and 2B show a circuit diagram of one practicable embodiment of the principal circuits in FIG. 1. In FIGS. 2A and 2B, each of the P-channel MOSFETs and each of the N-channel MOSFETs are depicted by symbols different from each other. The symbol representative of the P-channel MOSFET, such as a MOSFET $Q_7$, has one straight line added across the drain and source thereof, thereby to be distinguished from that of the N-channel MOSFET, such as a MOSFET $Q_6$. The illustrated P-channel MOSFETs and N-channel MOSFETs are of the enhancement mode type.

The memory array M-ARY consists of a plurality of memory columns and a plurality of word lines $W_1$ to $W_S$. The respective memory columns are identical in arrangement to one another. Accordingly, only one memory column is typically illustrated in detail in FIG. 2A. As shown in the figures, each memory column is constructed of one pair of complementary data lines D, $\overline{D}$, and memory cells which are arranged at a predetermined regularity and the input and output nodes of which are respectively coupled to either of the pair of complementary data lines D and $\overline{D}$. The memory cells are identical in arrangement to one another. One memory cell is constructed of, for example, a switching MOSFET $Q_{15}$ and a MOS capacitor C coupled thereto. The gate of the switching MOSFET in each memory cell is used as a terminal for selecting the particular memory cell. The selecting terminals of the respective memory cells are coupled to the corresponding word lines.

The precharge circuit PC1 is constructed of a switching MOSFET whose source-drain path is coupled between the complementary data lines D and $\overline{D}$, such as seen from MOSFET $Q_{14}$ typically illustrated.

As typically depicted, the unit circuit constituting the sense amplifier SA is constructed of a CMOS (complementary MOS) FET latch circuit which is composed of P-channel MOSFETs $Q_7$, $Q_9$ and N-channel MOSFETs $Q_6$, $Q_8$. One pair of input and output nodes of the CMOS FET latch circuit are coupled to the complementary data lines D and $\overline{D}$. Although no restriction is intended, the illustrated latch circuit is fed with the supply voltage $V_{CC}$ through P-channel MOSFETs $Q_{12}$, $Q_{13}$ in a parallel connection and is connected to the ground voltage $V_{SS}$ of the circuitry through N-channel MOSFETs $Q_{10}$, $Q_{11}$ in a parallel connection. These power switch MOSFETs $Q_{10}$, $Q_{11}$ and MOSFETs $Q_{12}$, $Q_{13}$ are used in common for the latch circuits (not shown) disposed in the other similar memory columns.

The timing signals $\phi_{pa1}$, $\overline{\phi_{pa1}}$ for activating the sense amplifier SA are applied to the gates of the MOSFETs $Q_{10}$, $Q_{12}$, while the timing signals $\phi_{pa2}$, $\overline{\phi_{pa2}}$ delayed with respect to the timing signals $\phi_{pa1}$, $\overline{\phi_{pa1}}$ are applied to the gates of the MOSFETs $Q_{11}$, $Q_{13}$. The timing signals $\phi_{pa1}$ and $\overline{\phi_{pa1}}$ are charged complementarily to each other so as to bring the power switch MOSFETs $Q_{10}$ and $Q_{12}$ into the "on" or "off" states with the same timing. Likewise, the timing signals $\phi_{pa2}$ and $\overline{\phi_{pa2}}$ are changed complementarily to each other so as to bring the power switch MOSFETs $Q_{11}$ and $Q_{13}$ into the "on" or "off" states with the same timing. That is, the timing signal $\overline{\phi_{pa1}}$, for example, in a phase-inverted timing signal relative to the timing signal $\phi_{pa1}$.

Each of the power switch MOSFETs $Q_{10}$ and $Q_{12}$ is endowed with a comparatively-low conductance. In contrast, each of the MOSFETs $Q_{11}$ and $Q_{13}$ is endowed with a comparatively-high conductance. Accordingly, the respective unit circuits (latch circuits) constituting the sense amplifier SA are activated comparatively weakly by the timing signals $\phi_{pa1}$ and $\overline{\phi_{pa1}}$, and they are subsequently activated more intensely by the timing signals $\phi_{pa2}$ and $\overline{\phi_{pa2}}$. Since, in this manner, the sense amplifier SA is activated in two divided stages, that great lowering (drop) in the high level potential of the complementary data lines which is otherwise brought about at the start of the operation of the sense amplifier can be prevented, and fast read-out of data can be executed.

More specifically, in a case where a minute read-out voltage from the memory cell is amplified by the sense amplifier SA, the MOSFETs $Q_{10}$, $Q_{12}$ of comparatively-low conductance are first brought into the "on" states by the timing signals $\phi_{pa1}$, $\overline{\phi_{pa1}}$. The sense amplifier SA responsively begins to amplify the potential difference between the complementary data lines. Since the potential difference between the complementary data lines is small in the initial period of the amplifying operation, the MOSFETs $Q_6$ and $Q_8$ constituting the sense amplifier SA are both held in the conductive states yet. For this reason, charges having previously been held in the data line on the high level side are transiently discharged through one side of the MOSFETs constituting the sense amplifier SA and the power switch MOSFET. Therefore, the potential on the high level side drops. Since, however, the conductances of the power switch MOSFETs $Q_{10}$, $Q_{12}$ which are first brought into the conductive states by the timing signals $\phi_{pa1}$ and $\overline{\phi_{pa1}}$ are set at a comparatively small value in advance, the quantity of the charges in the high level side data line to be undesirably discharged at this time can be limited to a small value, and the great drop of the high level side potential can be prevented. When the potential difference between the complementary data lines has become great to some extent, the switching MOSFETs $Q_{11}$, $Q_{13}$ of comparatively high conductance are brought into the "on" states by the timing signals $\phi_{pa2}$, $\overline{\phi_{pa2}}$, whereby the amplifying operation of the sense amplifier SA is rendered fast. Accordingly, the fast read-out can be effected while the drop of the potential of the high level side of the complementary data lines is prevented, by carrying out the amplifying operation of the sense amplifier SA in two divided stages in this manner.

The row decoder R-DCR is constructed of a plurality of unit circuits. In FIG. 2A, one unit circuit (corresponding to four word lines) constituting the row decoder R-DCR is typically shown. The illustrated row decoder R-DCR includes a NAND circuit ND of CMOS circuit arrangement which is composed of N-channel MOSFETs $Q_{32}$ to $Q_{36}$ and P-channel MOSFETs $Q_{37}$ to $Q_{41}$ that receive the internal address signals $a_2$ to $a_6$. Accordingly, four word line select signals for selecting the word lines $W_1$ to $W_4$ are formed by the NAND circuit ND.

The output of the NAND circuit ND is inverted by a CMOS inverter $IV_1$, and the inverted signal is transmitted through cut MOSFETs $Q_{28}$–$Q_{31}$ to the gates of MOSFETs $Q_{24}$–$Q_{27}$ which constitute a transfer gate circuit TRF.

The sources of the respective MOSFETs $Q_{24}$ to $Q_{27}$ are supplied with word line select timing signals $\phi_{X00}$ to $\phi_{X11}$. These word line select timing signals $\phi_{X00}$ to $\phi_{X11}$ are formed by a circuit (not shown) which forms a part of the row decoder R-DCR. The levels of the respective word line select timing signals $\phi_{X00}$ to $\phi_{X11}$ are determined by the combinations of the timing pulse $\phi_X$ with decode signals formed by decoding the address signals $a_0$, $a_1$ of two bits.

Although no special restriction is intended, the word line select timing signal $\phi_{X00}$ is brought to its high level in response to the change of the timing pulse $\phi_X$ to the high level (logic "1") when both the address signals $a_0$ and $a_1$ are at the low level (logic "0"). The signal $\phi_{X01}$ is brought to its high level in synchronism with the timing pulse $\phi_X$ when the address signal $a_0$ is at the high level and that $a_1$ is at the low level. Similarly, the signals $\phi_{X10}$ and $\phi_{X11}$ are brought to their high level in accordance with the address signals $a_0$ and $a_1$ and the timing pulse $\phi_X$.

Accordingly, the illustrated unit circuit constituting the row decoder R-DCR brings one of the word lines $W_1$–$W_4$ to its high level (selected level) in synchronism with the timing pulse $\phi_X$ when the output of the NAND circuit ND has been placed at the low level in accordance with the address signals $a_2$–$a_6$. The word line select timing signals $\phi_{X00}$–$\phi_{X11}$ are also fed to the other unit circuits (not shown) constituting the remainder of the row decoder R-DCR.

In addition, MOSFETs $Q_{20}$ to $Q_{23}$ whose gates are supplied with the output of the NAND circuit are interposed between the respective word lines and the ground potential. When the combination of the address signals $a_2$–$a_6$ does not indicate one set of word lines ($W_1$–$W_4$), that is, when the output of the NAND circuit ND is at the high level, the MOSFETs $Q_{20}$–$Q_{23}$ are responsively brought into the "on" states. As a result, the word lines $W_1$–$W_4$ are fixed to the ground potential by the MOSFETs $Q_{20}$–$Q_{23}$ when they are unselected. In this regard, the MOSFETs which are controlled by the output of the NAND circuit are disposed between the word lines and the ground potential point of the circuitry in order that, when the desired word line in one set of word lines is to be placed at the selected level, the remaining undesired word lines of other sets may be prevented from being placed at the selected level.

Resetting MOSFETs $Q_1$ to $Q_5$ whose gates are supplied with a reset pulse $\phi_{pw}$ are interposed between the respective word lines and the ground point of the circuitry. The word line selected in a preceding operation cycle, e.g., a read cycle is reset to the ground level for the next operation cycle in such a way that these MOSFETs $Q_1$–$Q_5$ turn "on" by receiving the reset pulse $\phi_{pw}$.

The column switch C-SW is constructed of MOSFETs which are interposed between the complementary data lines D, $\overline{D}$ and the common complementary data lines CD, $\overline{CD}$, such as MOSFETs $Q_{42}$, $Q_{43}$ typically illustrated in FIG. 2B. The gates of the MOSFETs $Q_{42}$, $Q_{43}$ are supplied with a select signal from the column decoder C-DCR.

The precharge MOSFET $Q_{44}$ which constructs the precharge circuit PC2 is interposed between the common complementary data lines CD and $\overline{CD}$.

One pair of input and output nodes of the main amplifier MA having a circuit arrangement similar to that of the sense amplifier SA are coupled to the common complementary data lines CD and $\overline{CD}$. Further, the complementary output nodes of the data input buffer DIB are coupled to the common data lines CD and $\overline{CD}$.

As shown in FIG. 2B, the edge trigger circuit $EGT_X$ ($EGT_Y$) is constructed of the exclusive OR circuits $EX_0$–$EX_i$ which receive the internal address signals $a_0$–$a_i$ ($a_{i+1}$–$a_j$) and the delayed signals of these internal address signals formed through delay circuits $D_0$–$D_i$, and the OR circuit which receives the output signals of the exclusive OR circuits $EX_0$–$EX_i$.

Next, the operations of the circuit of this embodiment will be described with reference to a waveform timing chart illustrated in FIG. 3.

The timing signals $\overline{\phi_{pa1}}$ and $\overline{\phi_{pa2}}$ are opposite in phase to the timing signals $\phi_{pa1}$ and $\phi_{pa2}$, as described before. In FIG. 3, the timing signals $\overline{\phi_{pa1}}$, $\overline{\phi_{pa2}}$ and $\overline{\phi_{ma1}}$, $\overline{\phi_{ma2}}$ are omitted in order to simplify the drawing.

Figure 3:
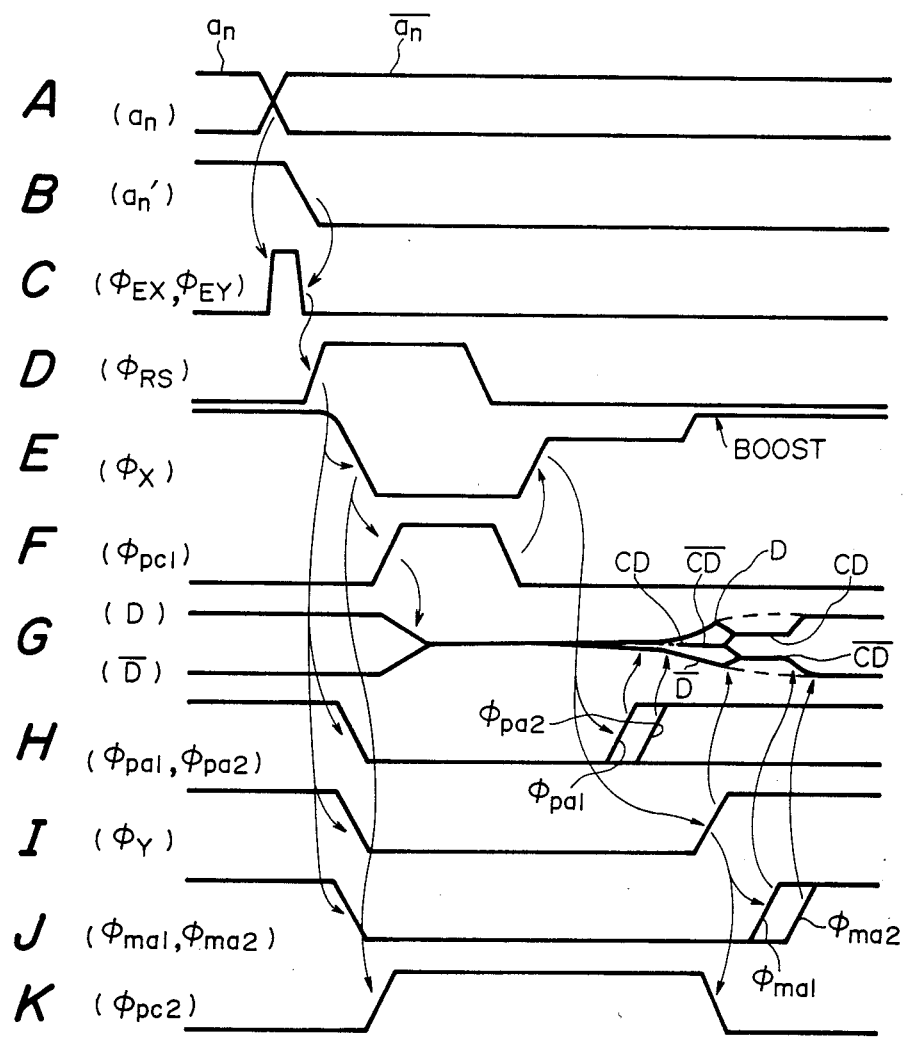
FIG. 3, consisting of A–K, is a timing chart showing an example of the operation of the disclosed embodiment.

Now, when any address signal $a_n$ falls from the high level to the low level, as shown in FIG. 3, $A_n$ by way of example, the delayed signal $a_n'$ thereof falls with a delay. Accordingly, the edge detection pulse $\phi_{EX}$ ($\phi_{EY}$), which is held at the high level ("1") from the beginning of the change of the address signal $a_n$ until the generation of the delayed signal $a_n'$, is outputted from the edge trigger circuit $EGT_X$ ($EGT_Y$).

Upon receiving the pulse $\phi_{EX}$ ($\phi_{EY}$), the timing generator TG forms therein a reset pulse $\phi_{RS}$ as shown in FIG. 3 at D. This reset pulse $\phi_{RS}$ resets the operating states of the respective circuits which have been determined in the preceding operation cycle, for example, a read operation cycle.

By way of example, the word lines are reset by the word line reset pulse $\phi_{PW}$ (now shown in FIG. 3) formed on the basis of the reset pulse $\phi_{RS}$. Likewise, the word line select timing signal $\phi_X$, the timing signals $\phi_{pa1}$, $\phi_{pa2}$ of the sense amplifier SA, the data line select timing signal $\phi_Y$, and the timing signals $\phi_{ma1}$, $\phi_{ma2}$ of the main amplifier MA, as shown at E, H, I, and J in FIG. 3, are brought into their reset states (reset levels) by the reset pulse $\phi_{RS}$. By way of example, the timing signals $\phi_X$, $\phi_{pa1}$, $\phi_{pa2}$, $\phi_Y$, $\phi_{ma1}$ and $\phi_{ma2}$ are brought to the low level.

At the same time that the timing signals $\phi_{pa1}$, $\phi_{pa2}$ and $\phi_{ma1}$, $\phi_{ma2}$ are at the low level, the timing signals $\overline{\phi_{pa1}}$, $\overline{\phi_{pa2}}$ and $\overline{\phi_{ma1}}$, $\overline{\phi_{ma2}}$ lying in the complementary relationship to the former signals are respectively brought to the high level. In consequence, the sense amplifier SA and main amplifier MA are respectively brought into their inactive statuses, and the complementary data lines D, $\overline{D}$ and the common complementary data lines CD, $\overline{CD}$ are brought into their floating states.

Parasitic capacitances (not shown) are coupled to the respective complementary data lines D, $\overline{D}$ and common complementary data lines CD, $\overline{CD}$. In the parasitic capacitances, charges corresponding to the potentials of the respectively associated data lines have been stored in the preceding operation cycle. By way of example, there will be studied the parasitic capacitance (not shown) coupled to the complementary data line D and the parasitic capacitance (not shown) coupled to the complementary data line $\overline{D}$. In a case where the complementary data line D was at the high level ($V_{CC}$) and the complementary data line $\overline{D}$ was at the low level (0V) in the preceding operation cycle by way of example, the parasitic capacitance of the data line D has stored charges corresponding to the high level ($V_{CC}$), and the parasitic capacitance of the data line $\overline{D}$ has stored charges corresponding to the low level (0 V). The respective parasitic capacitances of the common complementary data lines CD, $\overline{CD}$ are similarly placed at the high or low level.

The complementary data lines D, $\overline{D}$ and common complementary data lines CD, $\overline{CD}$ which have parasitic capacitances storing the charges determined in the preceding operation cycle in this manner are brought into the floating states as described above, so that the parasitic capacitances coupled to the complementary data lines D, $\overline{D}$ and common complementary data lines CD, $\overline{CD}$ hold the charges determined in the preceding operation cycle. Accordingly, the respective potentials of the complementary data lines D, $\overline{D}$ and common complementary data lines CD, $\overline{CD}$ are also held at their values in the preceding operation cycle. In the case where the predetermined charges have been respectively stored in the parasitic capacitance of the complementary data line D and that of the complementary data line $\overline{D}$ in the preceding operation cycle as in the above example, the parasitic capacitance in the complementary data line D put into the floating state as described above holds the charges corresponding to the high level ($V_{CC}$), and that in the complementary data line $\overline{D}$ similarly put into the floating state holds the charges corresponding to the low level (0 V). Therefore, the potential of the complementary data line D put into the floating state holds the high level ($V_{CC}$), while that of the complementary data line $\overline{D}$ holds the low level (0 V). This also applies to the common complementary data lines CD, $\overline{CD}$.

After all, owing to the inactivation of the sense amplifier SA and main amplifier MA, the complementary data lines D, $\overline{D}$ and common complementary data lines CD, $\overline{CD}$ come to hold the high level ($V_{CC}$) and low level (0 V) in the floating states.

At the timing at which the word lines have been reset, the precharge pulses $\phi_{pc1}$ and $\phi_{pc2}$ are generated.

Since the precharge MOSFETs $Q_{14}$ and $Q_{44}$ are turned "on" by the generation of the precharge pulses $\phi_{pc1}$ and $\phi_{pc2}$, the complementary data lines D and $\overline{D}$ and the common complementary data lines CD and $\overline{CD}$ are respectively short-circuited. As a result, the charges disperse between the complementary data lines D and $\overline{D}$ and between the common complementary data lines CD and $\overline{CD}$, so that the complementary data lines D, $\overline{D}$ and the common complementary data lines CD, $\overline{CD}$ are precharged to an intermediate level of about $V_{CC}/2$.

Subsequently, when the reset pulse $\phi_{RS}$ falls to the low level, the reset status is released. The precharge operation ends upon the release of the reset status.

After the end of the precharge of the complementary data lines D, $\overline{D}$ by the precharge signal $\phi_{pc1}$, the word line select timing signal $\phi_X$ rises to the high level, as illustrated in FIG. 3 at E. Thus, the high level signal outputted from the row decoder R-DCR is applied to one word line which is to be determined by the address signals $A_0$–$A_i$. The word line determined by the address signals $A_0$–$A_i$ is selected, and is brought to the select level of the memory cell. The switching MOSFET constituting the memory cell is brought into the "on" state by the high level potential of the selected word line.

Charge dispersion occurs between the storage capacitor of the selected memory cell and the parasitic capacitance of one data line, e.g., data line $\overline{D}$, to which the memory cell is coupled. The level of the data line $\overline{D}$ is changed to a level which corresponds to charges stored in the memory capacitor of the memory cell, in other words, data stored in the memory cell. Since, in this case, the memory cell coupled to the other data line D is not selected, this data line D holds the precharge level $V_{CC}/2$. As a result, a minute potential difference corresponding to the data held in the selected memory cell develops between the data lines D and $\overline{D}$. More specifically, the minute potential difference between the data lines D and $\overline{D}$ becomes as follows. In a case where charges corresponding to, e.g., $V_{CC}$, have been stored in the storage capacitor of the memory cell coupled to the data line $\overline{D}$, the potential of the data line $\overline{D}$ becomes higher than the potential ($V_{CC}/2$) of the data line D. In contrast, in a case where charges corresponding to, e.g., 0 V, have been stored in the storage capacitor of the memory cell, in order words, in a case where no charge has been stored in the storage capacitor, the potential of the data line $\overline{D}$ becomes lower than the potential ($V_{CC}/2$) of the data line D.

When the sense amplifier is activated, the minute potential difference between the data lines $\overline{D}$ and D is thereby amplified. That is, upon the subsequent change of the timing signal $\phi_{pa1}$ to the high level (the timing signal $\overline{\phi_{pa1}}$ to the low level), the sense amplifier SA is activated, and an amplifying operation which enlarges the potential difference between the complementary data lines D and $\overline{D}$ is started by the sense amplifier SA. Subsequently, the timing signal $\phi_{pa2}$ reaches the high level (the timing signal $\overline{\phi_{pa2}}$ the low level). Thus, the gain of the sense amplifier SA is increased, and the potential difference between the complementary data lines D and $\overline{D}$ is enlarged even more.

Next, at the same time that the data line select timing signal $\phi_Y$ is brought to the high level, the precharge signal $\phi_{pc2}$ is placed at the low level. Owing to the change of the precharge signal $\phi_{pc2}$ to the low level, the MOSFET Q44 is brought into the "off" state, with the result that the precharge of the common complementary data lines CD, $\overline{CD}$ ends.

When the data line select timing signal $\phi_Y$ is placed at the high level, column select signals for coupling to the common data lines CD, $\overline{CD}$ one pair of complementary data lines D, $\overline{D}$ which are to be determined by the address signals $A_{i+1}$-$A_j$ are supplied from the column decoder C-DCR to the column switch CSW. Therefore, one pair of complementary data lines D, $\overline{D}$ to be selected by the column select signals are coupled to the common complementary data lines CD, $\overline{CD}$ through the column switch CSW.

With a timing relationship in which, about the time when the complementary data lines D, $\overline{D}$ are coupled to the common complementary data lines CD, $\overline{CD}$, the precharge of the common complementary data lines CD, $\overline{CD}$ is completed by the precharge signal $\phi_{pc2}$, the potentials of the common data lines CD, $\overline{CD}$ can be equalized to each other when noise, etc., has acted on the common data lines before the coupling between the common data lines and the data lines. For this reason, the potential difference between the selected data lines D, $\overline{D}$ is accurately transmitted to the common data lines CD, $\overline{CD}$, so that this semiconductor memory can be rendered immune against noise.

Also, the complementary data lines CD, $\overline{CD}$ are precharged to $V_{CC}/2$ by the precharging operation of the precharge MOSFET Q44 as described before. The potential of the common data line $\overline{CD}$ is therefore determined by the charge dispersion of the charges stored in the parasitic capacitance of the common data line $\overline{CD}$ (charges corresponding to $V_{CC}/2$) and charges stored in the parasitic capacitance of the data line $\overline{D}$ selected and coupled to this common data line $\overline{CD}$. Likewise, the potential of the common data line CD is determined by the charge dispersion of the charges stored in the parasitic capacitance of the common data line CD (charges corresponding to $V_{CC}/2$) and charges stored in the parasitic capacitance of the data line D selected and coupled to the common data line CD.

When the complementary data lines D, $\overline{D}$ are coupled to the common complementary data lines CD, $\overline{CD}$, the potential of the common data line CD which is determined by the charge dispersion of the charges of the parasitic capacitance of the data line D and those of the parasitic capacitance of the common data line CD becomes higher (lower) than the potential of the common data line $\overline{CD}$ which is determined by the charge dispersion of the charges of the parasitic capacitance of the data line $\overline{D}$ and those of the parasitic capacitance of the common data line $\overline{CD}$.

Line G in FIG. 3 illustrates with solid lines the respective potential changes of the data lines D, $\overline{D}$ and common data lines CD, $\overline{CD}$ in the case where the memory cell coupled to the data line D is selected and where the charges corresponding to $V_{CC}$ are stored in the storage capacitor of the selected memory cell (or the case where the memory cell coupled to the data line $\overline{D}$ is selected and where the charges corresponding to 0 V are stored in the storage capacitor of the memory cell).

The potential difference between the common data lines CD and $\overline{CD}$ is amplified by the main amplifier MA. More specifically, when the timing signals $\phi_{ma1}$, $\phi_{ma2}$ are subsequently at the high level and the timing signals $\overline{\phi_{ma1}}$, $\overline{\phi_{ma2}}$ are at the low level, the main amplifier MA is operated in response to these changes, and the potential difference between the common data lines CD and $\overline{CD}$ is amplified.

In the reading operation, the potential difference amplified by the main amplifier MA is supplied to the data output buffer DOB. The data output buffer DOB transmits an output signal corresponding to its input signal to the terminal I/O.

In the writing operation, write data is transmitted to the common data lines CD, $\overline{CD}$ through the data input buffer DIB. The levels of the data lines D, $\overline{D}$ are determined in accordance with the write data supplied to the common data lines CD, $\overline{CD}$. As a result, the write data is transmitted to the selected memory cell.

Although no special restriction is intended, in order to apply a voltage of at least the supply voltage $V_{CC}+V_{th}$ (the threshold voltage of the switching MOSFET) to the gate of the switching MOSFET of the memory cell in writing data into the memory cell, the word line select timing signal $\phi_X$ is brought to a high level of at least the supply voltage $V_{CC}+V_{th}$ by a bootstrap circuit (not shown). Thus, the high level ($V_{CC}$) of the data line as it is can be transmitted to the MOS capacitor of the memory cell without any level loss, and charges to be stored in the MOS capacitor can be increased.

Also, in refreshing the memory cell, the word line select timing signal $\phi_X$ is brought to the high level of at least the supply voltage $V_{CC}+V_{th}$ by the bootstrap (not shown). Thus, the high level ($V_{CC}$) of the data line kept intact in rewritten without any level loss into the MOS capacitor of the memory cell having held the high level.

In the reading operation, the potentials of the selected complementary data lines are amplified to the high level ($V_{CC}$) and low level (0 V) by the sense amplifier SA, and the potentials of the common complementary data lines are similarly amplified to the high level ($V_{CC}$) and low level (0 V) by the main amplifier MA. Also, the potentials of the unselected complementary data lines are amplified to the high level ($V_{CC}$) and low level (0 V) by the sense amplifiers SA of the corresponding columns.

By way of example, as indicated by the solid lines in G of FIG. 3, the selected data line D and common data line CD are respectively amplified to the high level ($V_{CC}$) by the sense amplifier SA and main amplifier MA, while the selected data line $\overline{D}$ and common data line $\overline{CD}$ are respectively amplified to the low level (0 V) by the sense amplifier and main amplifier. In addition, as indicated by dotted lines in G of FIG. 3, the unselected one of the complementary data lines is amplified to the high level ($V_{CC}$), and the remaining complementary data line is amplified to the low level (0 V) by the sense amplifier SA.

The potentials of the data lines placed at the high level or low level in this manner are transmitted to the MOS capacitor of the memory cell in the refresh operation described above.

Also, in the writing operation, in accordance with data to be written, the potentials of the common data lines and the data lines are respectively placed at the high level ($V_{CC}$) or low level (0 V) by the data input buffer DIB and sense amplifier SA. By way of example, in accordance with the data to be written, the potentials of the common data line CD and data line D are brought to the high level ($V_{CC}$), and those of the common data line $\overline{CD}$ and data line $\overline{D}$ are brought to the low level (0 V).

In this manner, in any operation, the potentials of the data lines D, $\overline{D}$ are respectively placed at the high level ($V_{CC}$) or low level (0 V), and also the potentials of the common data lines CD, $\overline{CD}$ are respectively placed at the high level ($V_{CC}$) or low level (0 V). In consequence, changes corresponding to the high level and those corresponding to the low level are stored in the respective capacitances of the data lines D and $\overline{D}$. Likewise, charges corresponding to the high level and those corresponding to the low level are stored in the respective capacitances of the common data lines CD and $\overline{CD}$. That is, when the charges corresponding to the high level ($V_{CC}$ level) are stored in the capacitance of one data line (common data line), the charges corresponding to the low level (0 V level) are stored in the capacitance of the other data line (common data line).

The charges stored in the respective capacitances of the data lines D, $\overline{D}$ and common data lines CD, $\overline{CD}$ in this manner are used for the precharge of the data lines D, $\overline{D}$ and the precharge of the common data lines CD, $\overline{CD}$ as described before. That is, the charges are used for precharging the data lines and common data lines in the next operation.

In this embodiment, although no restriction is especially intended, in the case of writing logic "1" into the memory cell coupled to one data line D of the complementary data lines, charges corresponding to, e.g., the supply voltage $V_{CC}$, are stored in the storage capacitor of the memory cell. In contrast, in the case of similarly writing logic "1" into the memory cell coupled to the other data line $\overline{D}$, charges corresponding to the ground potential (0 V) of the circuitry are stored in the memory cell. In addition, in the case of writing logic "0" into the memory cell coupled to one data line D, charges corresponding to the ground potential (0 V) are stored in the storage capacitor of the memory cell, and in the case of writing logic "0" into the memory cell coupled to the other data line $\overline{D}$, charges corresponding to the supply voltage $V_{CC}$ are stored in the storage capacitor of the memory cell.

Figure 2B:
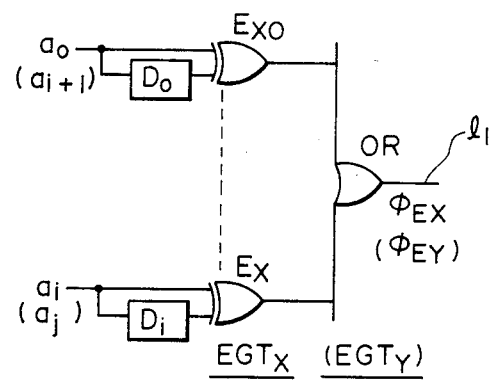

More specifically, as illustrated in FIG. 2, when the potential of the I/O terminal is at the high level (logic "1"), the data input buffer DIB brings the common data line CD to the high level ($V_{CC}$) and the common data line $\overline{CD}$ to the low level (0 V) by way of example. Conversely, when the potential of the I/O terminal is at the low level (logic "0"), the data input buffer DIB brings the common data line CD to the low level (0 V) and the common data line $\overline{CD}$ to the high level ($V_{CC}$). Although not especially restricted in this respect, the main amplifier MA amplifies the level of one common data line CD and then transmits it to the node CDI of the output buffer DOB, and it amplifies the level of the other common data line $\overline{CD}$ and then transmits it to the other node $\overline{CDI}$ of the output buffer DOB. Although not especially restricted in this respect, the output buffer DOB is so arranged that when the level of the node CDI is higher than the level of the node $\overline{CDI}$, it supplies an output signal of high level (logic "1") to the terminal I/O, whereas when the level of the node CDI is lower than the level of the node $\overline{CDI}$, it supplies an output signal of low level (logic "0") to the terminal I/O.

According to this arrangement, the complementary signals delivered from the main amplifier MA are supplied to the data output buffer DOB. The arrangement in FIG. 2B, however, may well be replaced with, for example, an arrangement wherein only one of the complementary signals delivered from the main amplifier MA is supplied to the data output buffer DOB. In this case, the data output buffer DOB can have, for example, an arrangement which compares a certain reference voltage (for example, the logic threshold voltage of the DOB) and the level of the signal from the main amplifier MA and which supplies the I/O terminal with an output signal in accordance with the result of the comparison.

The timing generator circuit TG is so arranged as to provide the precharge signal $\phi_{pc2}$, timing signal $\phi_Y$, main amplifier control signals $\phi_{ma1}$, $\phi_{ma2}$, etc., on the basis of, not only the detection signal $\phi_{EX}$ from the edge trigger circuit $EGT_X$, but also the detection signal $\phi_{EY}$ from the edge trigger circuit $EGT_Y$ directed toward the column-group address signals. Thus, it becomes possible to successively read out data amplified by the sense amplifiers in advance.

That is, when the column-group address signals $A_{i+i}$ to $A_j$ are successively changed after supplying one set of row-group address signals $A_O$ to $A_i$ to the memory, the data can be read out from the corresponding addresses.

The detection signals $\phi_{EX}$ and $\phi_{EY}$ may well be caused to correspond respectively to a row address strobe signal and a column address strobe signal which are supplied to a memory of the known address multiplexing system. Accordingly, the logic construction of the timing generator circuit for forming the various timing signals mentioned before may well be similar to that of a timing generator circuit in the known memory arrangement.

Although not especially restricted in this respect, this embodiment is provided with a substrate bias voltage generator circuit $V_{BB}$-G in order to attain fast operation of the memory.

Further, although not especially restricted in this respect, this embodiment is so arranged that, for the purpose of rendering the power dissipation low, the main amplifier MA is prevented from operating during the writing operation.

In the semiconductor memory of this embodiment, the precharge operation is executed by utilizing the edge of the address signal. The semiconductor memory can therefore be handled similar to the conventional MOS static type RAM, except that any timing signal to be externally supplied to the memory is dispensed with and that the refresh operation is required. Accordingly, the external timing control can be simplified.

As constituent memory cell, it is possible to use a memory cell of the type which is used in the dynamic type RAM, for example, a memory cell of comparatively-small occupying area which is constructed of a single switching MOSFET and a single storage capacitor as stated before. In consequence, the operation control can be assimilated to that of the static type RAM, and the memory capacity can be rendered large.

The precharge operation is such that one pair of complementary data lines and common complementary data lines are merely short-circuited, thereby to be brought to the intermediate level (about $V_{CC}/2$) below the $V_{CC}$ level. This precharge operation can be executed at high speed because the magnitude of the level change can be rendered smaller than in the precharge of the conventional dynamic type RAM in which data lines are charged up from 0 V to the $V_{CC}$ level. Since the precharge level in the embodiment is the intermediate level below the $V_{CC}$ level as stated above, the precharge MOSFETs satisfactorily fall into "on" states even when the gate voltage thereof is set at the ordinary logic level ($V_{CC}$). Thus, a satisfactory precharge level can be formed. In contrast, in the case of precharging the data lines to the $V_{CC}$ level as in the prior art, a high bootstrap voltage above the $V_{CC}$ level needs to be applied to the gate of a precharge MOSFET in order to sufficiently raise the precharge level. As a result, the circuit becomes complicated, and circuit operations becomes slow due to the complicated circuit. In accordance with the embodiment, the precharge level is formed by the charge dispersion of the complementary data lines, and hence, no current is dissipated at the precharge operation. Therefore, the power dissipation can be lowered.

Since the precharge level is the intermediate level of about $V_{CC}/2$, the switching MOSFET in the memory cell falls into the "on" state favorably in reading out data from the memory cell even when its gate voltage (word line potential) is the ordinary logic high level ($V_{CC}$). More specifically, the switching MOSFET in the memory cells turns "on" in an unsaturation region when its gate voltage becomes at least $\frac{1}{2} V_{CC} + V_{th}$. As a result, all charges in the MOS capacitor can be read out even when the bootstrap voltage is not used as in the conventional dynamic type RAM. Accordingly, fast read-out and high reliability can be realized.

Since dummy memory cells as used in the conventional dynamic type RAM are not needed, the chip size can be reduced in proportion to the area previously occupied by the dummy memory cells and that part corresponding to the area occupied by a dummy word line selector circuit. Further, since the read-out reference voltage to be referred to by the sense amplifier SA is formed of the equal precharge levels of the complementary data lines D, $\overline{D}$ immediately before the read-out, it follows the fluctuation of the supply voltage $V_{CC}$, etc. Moreover, the read-out reference voltage is, in effect, free from influence by the dispersion of elements in the memory cells and such dummy memory cells. As a result, the operating margin of the circuit can be sharply enhanced.

Further, in a case where peripheral circuits including the sense amplifier SA are constructed of CMOS circuits, a lower power dissipation can be attained. Especially the sense amplifier SA and the main amplifier MA should desirably be constructed of CMOS circuits. More specifically, when the sense amplifier SA and main amplifier MA are respectively constructed of CMOS circuits which are composed of P-channel MOSFETs and N-channel MOSFETs, it is possible, without providing a special circuit, such as an active restore circuit, to amplify the potentials of the complementary data lines D, $\overline{D}$ to the supply voltage ($V_{CC}$) and the ground potential (0 V) of the circuitry, respectively, and also to amplify the potentials of the common complementary data lines CD, $\overline{CD}$ to the supply voltage ($V_{CC}$) and the ground potential (0 V) of the circuitry, respectively. Therefore, the potential difference between the data lines D, $\overline{D}$ and that between the common data lines CD, $\overline{CD}$ at the reading operation, writing operation or refresh operation can be rendered great with a simple circuit, so that malfunctions can be reduced. Owing to the provision of such sense amplifier, charges corresponding to the supply voltage ($V_{CC}$) and those corresponding to the ground potential (0 V) can be stored in the respective parasitic capacitances of the data lines D, $\overline{D}$ before the precharge operation is started, so that the precharge levels of the data lines D, $\overline{D}$ can be brought to about $V_{CC}/2$ by the execution of the precharge operation. This also applies to the common complementary data lines CD, $\overline{CD}$.

The address buffers X-ADB, Y-ADB, the edge trigger circuits $EGT_X$, $EGT_Y$ and the timing generator circuit TG described above should desirably be constructed of static type circuits so that the output signals may be formed whenever the respective input signals change.

This invention is not restricted to the foregoing embodiment. For example, the peripheral circuits of the sense amplifier SA, etc., may well be constructed of MOSFETs of either one channel type, P-channel MOSFETs or N-channel MOSFETs in order to reduce the chip area. However, in the case of constructing, e.g., the sense amplifier SA out of only the single-channel MOSFETs, it is necessary to add a special circuit for normally keeping the potentials of the respective data lines D, $\overline{D}$ at the high level ($V_{CC}$) and the low level (0 V). As the special circuit, it is possible to use a so-called active restore circuit, which is a kind of bootstrap circuit.

One-side data lines in the memory array M-ARY may well be constructed as dummy data lines. The respective complementary data lines D, $\overline{D}$ may have dummy cells coupled thereto as well. In this case, the circuit is so arranged that when the memory cell coupled to one complementary data line is selected, the dummy cell coupled to the other complementary data line is selected. Thus, the potential change of the word line is transmitted to the one data line through the undesired capacitance of the switching MOSFET of the selected memory cell (the overlap capacitance between the gate electrode of the FET and the one data line), while at the same time the potential change of a word line for the dummy cell is transmitted to the other data line through the undesired capacitance of the switching MOSFET of the selected dummy cell. In this regard, a potential change afforded to a data line in response to the potential change of a word line is regarded as noise. However, potential changes simultaneously afforded to a pair of data lines are regarded as inphase noise. The sense amplifier is, in effect, insensitive to the inphase noise. Accordingly, the malfunctions of the circuit can be further reduced in spite of the undesired potential changes afforded to the pair of complementary data lines.

As the edge trigger circuit, it is also possible to employ an OR or AND gate which receives the complementary address signals $a_0$, $\overline{a_0}$ and whose logic threshold voltage is biased to the high level or low level side. The edge trigger circuit may well be one with which a plurality of bit data is read/written in parallel. Further, the peripheral circuits can adopt various aspects of performance. In addition, redundant memory arrays for saving defective bits and a switching circuit therefor may well be comprised. Further, the auto-refresh function may well be included.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A semiconductor memory comprising:
   a plurality of dynamic memory cells;
   a first selector circuit which receives first address signals and which selects ones of said plurality of dynamic memory cells specified by the first address signals, and the time of which is controlled by a first timing signal;
   a plurality of pairs of data lines connected to said dynamic memory cells so that each pair of data lines is respectively provided with a potential difference in accordance with the data read out from a selected dynamic memory cell;
   a plurality of sense amplifiers each of which has a pair of input and output terminals that are coupled to a corresponding pair of data lines, the respective sense amplifiers having their operations controlled by second timing signals;
   a first precharge circuit which is coupled to said plurality of pairs of data lines and operates so as to precharge said data lines at a potential intermediate between binary signals to be stored in the dynamic memory cells in accordance with a third timing signal;
   a first detector circuit including means connected to receive said first address signals for detecting level changes in the first address signals; and
   a timing generator circuit connected to receive the detection outputs of said first detector circuit, and including means for generating said third timing signal for operating said first precharge circuit, said first timing signal for operating said first selector circuit after stopping the operation of said first precharge circuit, and said second timing signals for operating said sense amplifiers.

2. A semiconductor memory according to claim 1, wherein said each dynamic memory cell is constructed of a MOSFET whose gate is used as a selecting terminal, and a charge holding capacitor which is coupled to said MOSFET.

3. A semiconductor memory according to claim 2, wherein said precharge circuit is constructed of MOSFETs each of which short-circuits a corresponding pair of data lines in response to said third timing signal supplied from said timing generator circuit.

4. A semiconductor memory according to claim 3, wherein said each sense amplifier is constructed of a complementary MOSFET circuit.

5. A semiconductor memory according to claim 4, further comprising:
   a pair of common data lines;
   a second selector circuit including means connected to receive applied second address signals for coupling said common data lines to the pair of data lines specified by the second address signals among said plurality of pairs of data lines with an operation timing which is controlled by a fourth timing signal;
   a second precharge circuit which is coupled to said common data lines and operates to precharge said common data lines in accordance with a fifth timing signal;
   a main amplifier which is coupled to said common data lines;
   means for controlling the operation timing of said main amplifier in response to a sixth timing signal;
   a second detector circuit including means connected to receive said second address signals for detecting changes in the second address signals; and
   said timing generator circuit including means responsive to outputs of said first and second detector circuits for generating said fourth, fifth and sixth timing signals for controlling operation timings of said second selector circuit, said second precharge circuit and said main amplifier, respectively.

6. A semiconductor memory according to claim 5, wherein said main amplifier is constructed of a complementary MOSFET circuit.

7. A semiconductor memory according to claim 5, wherein said second precharge circuit functions to charge said pair of common data lines at a potential intermediate between binary signals to be stored in the dynamic memory cells.

8. A semiconductor memory according to claim 3, wherein said first detector circuit and said timing generator circuit are constructed of static type complementary MOSFET circuits.

9. A semiconductor memory according to claim 3, wherein said each of said sense amplifiers is constructed of a static type complementary MOSFET latch circuit, a first switching MOSFET which is interposed between one power feed terminal of said latch circuit and a power source terminal, and a second switching MOSFET which is interposed between a remaining power feed terminal of said latch circuit and another power source terminal.

* * * * *